United States Patent
Mondada et al.

(10) Patent No.: US 8,501,509 B2
(45) Date of Patent: Aug. 6, 2013

(54) MULTI-DIMENSIONAL SOLID STATE LIGHTING DEVICE ARRAY SYSTEM AND ASSOCIATED METHODS AND STRUCTURES

(75) Inventors: Alan Mondada, Boise, ID (US); Fernando Gonzalez, Burleson, TX (US); Willard L. Hofer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 12/868,401

(22) Filed: Aug. 25, 2010

(65) Prior Publication Data

US 2012/0049203 A1    Mar. 1, 2012

(51) Int. Cl.
*H01L 21/00*    (2006.01)

(52) U.S. Cl.
USPC .................. 438/29; 438/24; 438/25; 438/27; 257/88; 257/99

(58) Field of Classification Search
USPC ...... 257/88, 99, 680, 675, 686, 692, E33.056, 257/E21.499; 438/24–25, 27, 29, 116
See application file for complete search history.

(56) References Cited

U.S. PATENT DOCUMENTS

| | | | |
|---|---|---|---|
| 6,250,774 B1 | 6/2001 | Begemann et al. | |
| 6,452,217 B1 | 9/2002 | Wojnarowski et al. | |
| 6,635,987 B1 | 10/2003 | Wojnarowski et al. | |
| 7,153,000 B2 | 12/2006 | Park et al. | |
| 7,157,839 B2 | 1/2007 | Ouderkirk et al. | |
| 7,302,181 B2 | 11/2007 | Ng et al. | |
| 7,508,061 B2 * | 3/2009 | Kang et al. | 257/692 |
| 7,687,813 B2 | 3/2010 | Nakamura et al. | |
| 8,029,165 B2 | 10/2011 | Livesay et al. | |
| 2005/0207152 A1 | 9/2005 | Maxik | |
| 2009/0295266 A1 | 12/2009 | Ramer et al. | |
| 2009/0323334 A1 | 12/2009 | Roberts et al. | |
| 2010/0103678 A1 | 4/2010 | Van de Ven et al. | |
| 2010/0270567 A1 * | 10/2010 | Emerson et al. | 257/89 |

OTHER PUBLICATIONS

International Search Report and Written Opinion issued Nov. 29, 2011 in International Application No. PCT/US2011/047455, 8 pages.

* cited by examiner

*Primary Examiner* — Theresa T Doan
(74) *Attorney, Agent, or Firm* — Perkins Coie LLP

(57) ABSTRACT

A multi-dimensional solid state lighting (SSL) device array system and method are disclosed. An SSL device includes a support, a pillar having several sloped facets mounted to the support, and a flexible substrate pressed against the pillar. The substrate can carry a plurality of solid state emitters (SSEs) facing in various directions corresponding to the sloped facets of the pillar. The flexible substrate can be a flat substrate prepared using planar mounting techniques, such as wirebonding techniques, before bending the substrate against the pillar.

17 Claims, 10 Drawing Sheets

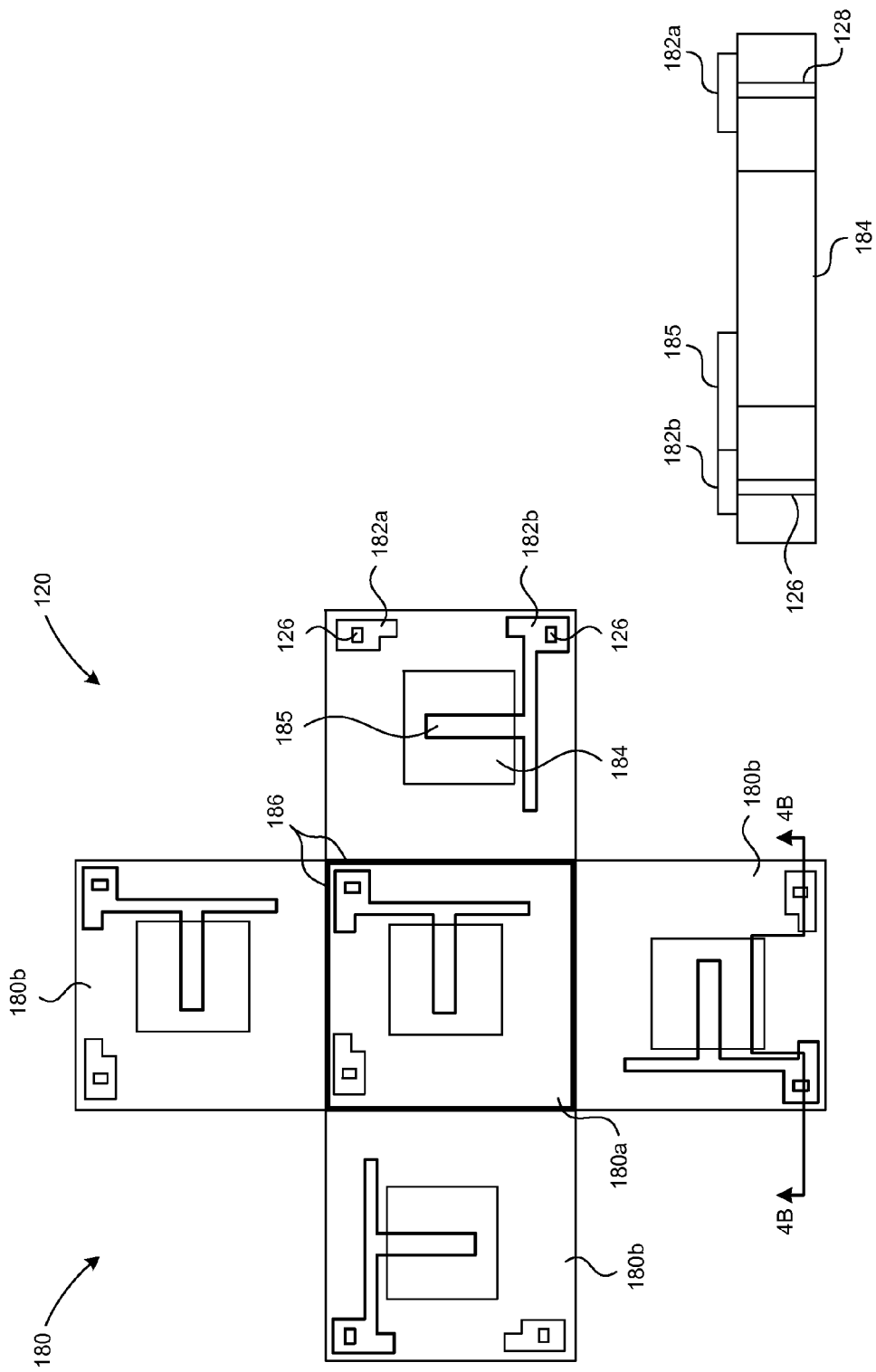

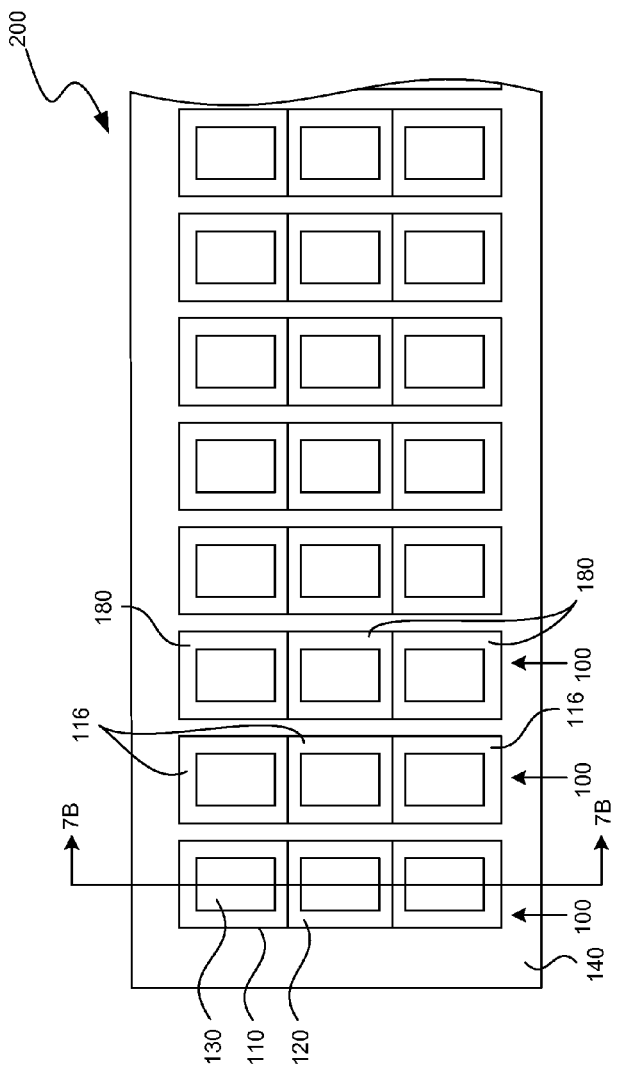
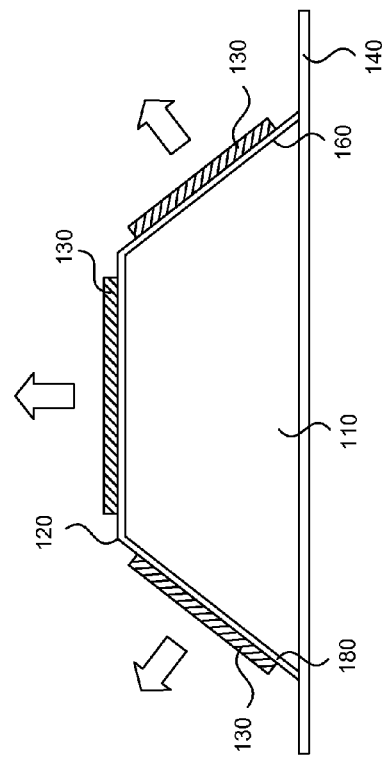
FIG. 7A
FIG. 7B

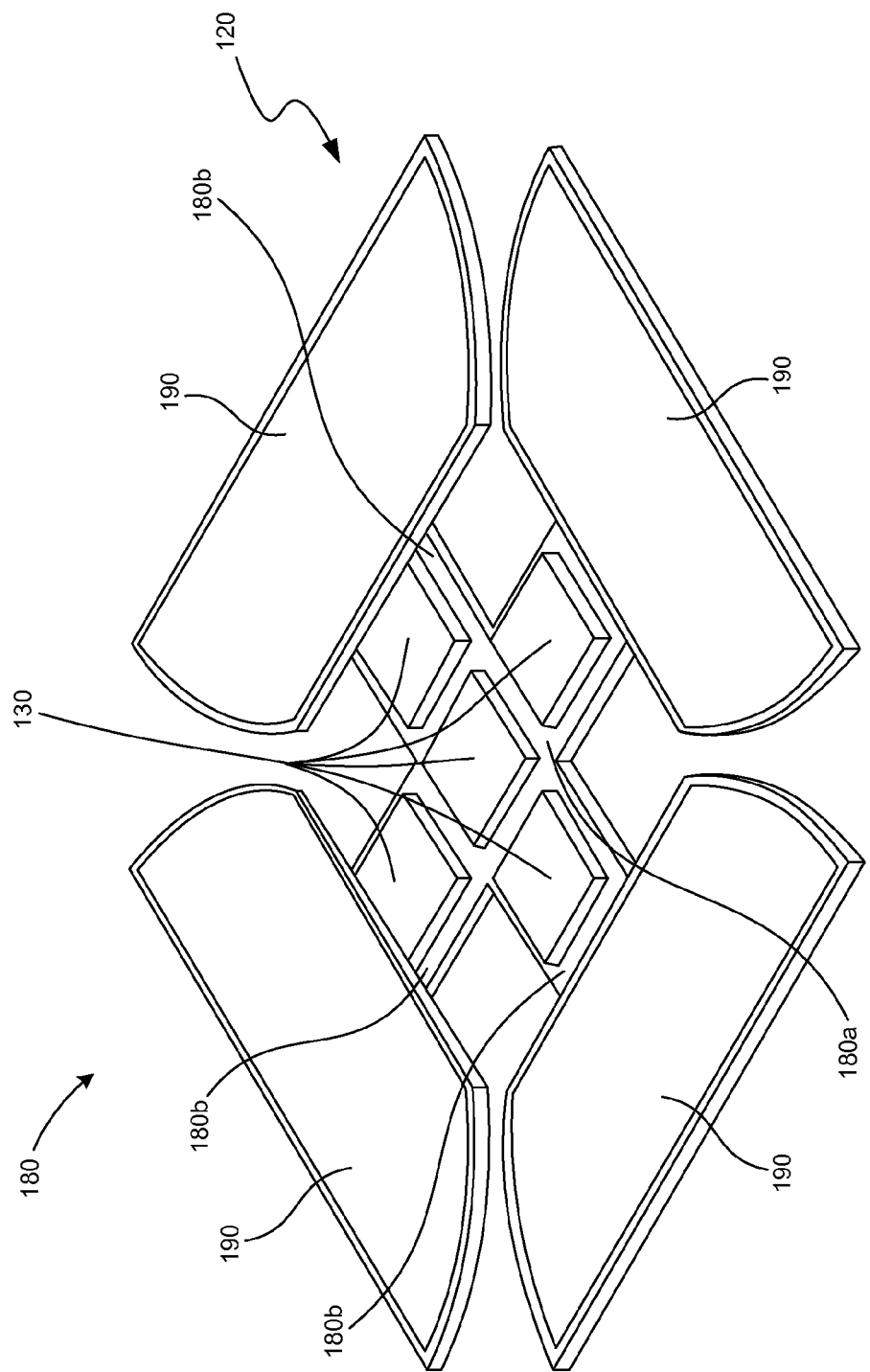

MULTI-DIMENSIONAL SOLID STATE LIGHTING DEVICE ARRAY SYSTEM AND ASSOCIATED METHODS AND STRUCTURES

TECHNICAL FIELD

The present disclosure is related to solid state lighting (SSL) devices and associated methods of operation and manufacture. In particular, the present disclosure is related to solid state emitters (SSEs) and three-dimensional structures associated with the SSEs.

BACKGROUND

SSLs use semiconductor light-emitting diodes ("LEDs"), polymer light-emitting diodes ("PLEDs"), organic light-emitting diodes ("OLEDs"), or other types of solid state emitters (SSEs) as sources of illumination. Generally, SSLs generate less heat, provide greater resistance to shock and vibration, and have longer life spans than conventional lighting devices that use filaments, plasma, or gas as sources of illumination (e.g., florescent or incandescent lights). SSL devices are increasingly in demand for many purposes because such devices efficiently produce high-intensity, high-quality light. Mobile phones, personal digital assistants, digital cameras, MP3 players, and other portable devices use SSLs, such as white light SSLs, for background illumination. The possible applications for SSL devices extend beyond portable devices and include ceiling panel lights, desk lamps, refrigerator lights, table lamps, street lights, automobile headlights, and many other lighting applications.

White light is desirable for many applications, but current SSLs cannot directly produce white light. One conventional technique for emulating white light from an SSL includes depositing a converter material (e.g., a phosphor) on a light emitting material. For example, as shown in FIG. 1A, a conventional SSL device 10 includes a support 2 carrying an LED die 4 and a converter material 6 deposited on the LED die 4. The LED die 4 can include one or more light emitting components. For example, as shown in FIG. 1B, the LED die 4 can include a silicon substrate 12, an N-type gallium nitride (GaN) material 14, an indium gallium nitride (InGaN) material 16 (and/or GaN multiple quantum wells), and a P-type GaN material 18 on one another in series. The LED die 4 can also include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

Another conventional construction of an SSL device 20 is shown in FIG. 2. The device 20 has a support 23 upon which an LED 24 is mounted. The device 20 also includes a phosphor well 26 containing a converter material and a lens 28 formed over the LED 24. This configuration produces light primarily focused in a direction 29 perpendicular to the LED 24. The lighting distribution from this arrangement is suitable for some lighting applications. However, many other applications can benefit from a more dispersed angular distribution of light. Accordingly, there remains a need for SSL devices that produce multi-directional light patterns.

BRIEF DESCRIPTION OF THE DRAWINGS

FIG. 4A is a partially schematic top view of an interface member for use with an SSL device in accordance with several embodiments of the present technology.

FIG. 4B is a partially schematic cross-sectional view of the interface member of FIG. 4A in accordance with several embodiments of the present technology.

FIG. 7A is a partially schematic top view of an array of SSL devices in accordance with several embodiments of the present technology.

FIG. 7B is a partially schematic side view of an SSL device in the array of similar SSL devices of FIG. 7A in accordance with embodiments of the present technology.

FIG. 8A is a partially schematic isometric view of an interface member and extensions for an SSL device in accordance with another embodiment of the present technology.

DETAILED DESCRIPTION

Various embodiments of solid state lights ("SSLs") and associated methods of manufacturing SSLs are described below. The term "SSL" generally refers to "solid state light" and/or "solid state lighting" according to the context in which it is used. The terms "SSL emitter" or "solid state emitter" ("SSE") generally refer to solid state components that convert electrical energy into electromagnetic radiation in the visible, ultraviolet, infrared and/or other spectra. SSEs include light-emitting diodes (LEDs), which are semiconductor diodes that convert electrical energy into electromagnetic radiation in a desired spectrum. SSEs can also include polymer light-emitting diodes (PLEDs) and organic light-emitting diodes (OLEDs). The term "phosphor" generally refers to a material that can continue emitting light after exposure to energy (e.g., electrons and/or photons). A person skilled in the relevant art will understand that the new technology may have additional embodiments and that the new technology may be practiced without several of the details of the embodiments described below with references to FIGS. 3-8C.

Figure 1A:
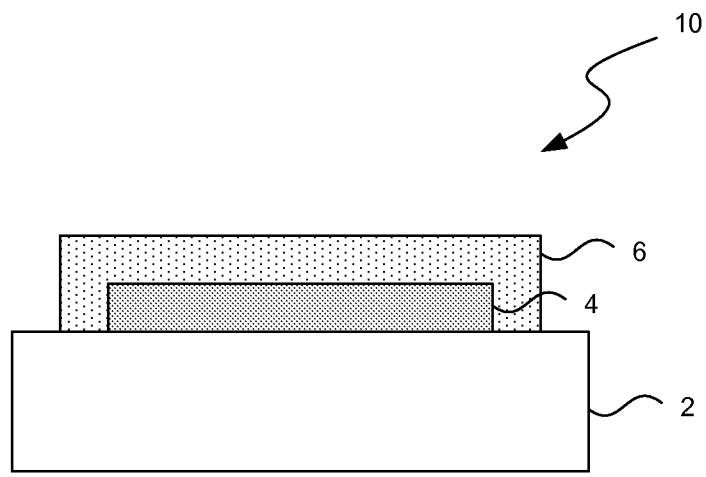
FIG. 1A is a partially schematic cross-sectional view of an SSL device in accordance with the prior art.
Figure 1B:
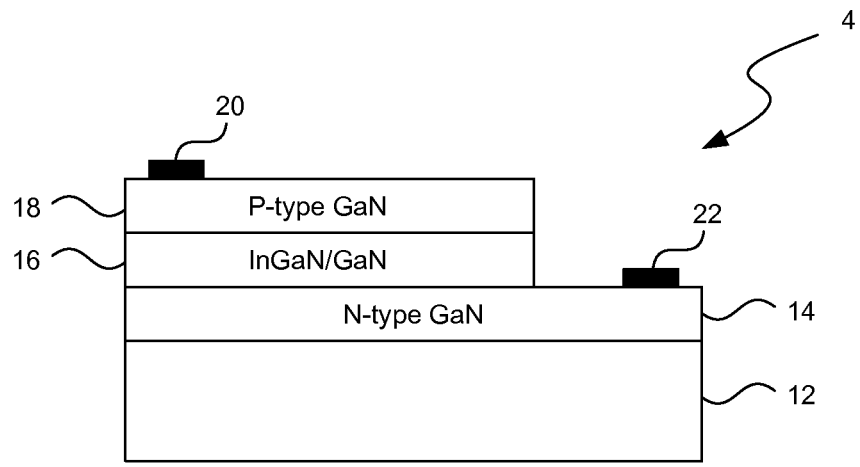
FIG. 1B is a partially schematic cross-sectional view of an LED in accordance with the prior art.
Figure 2:
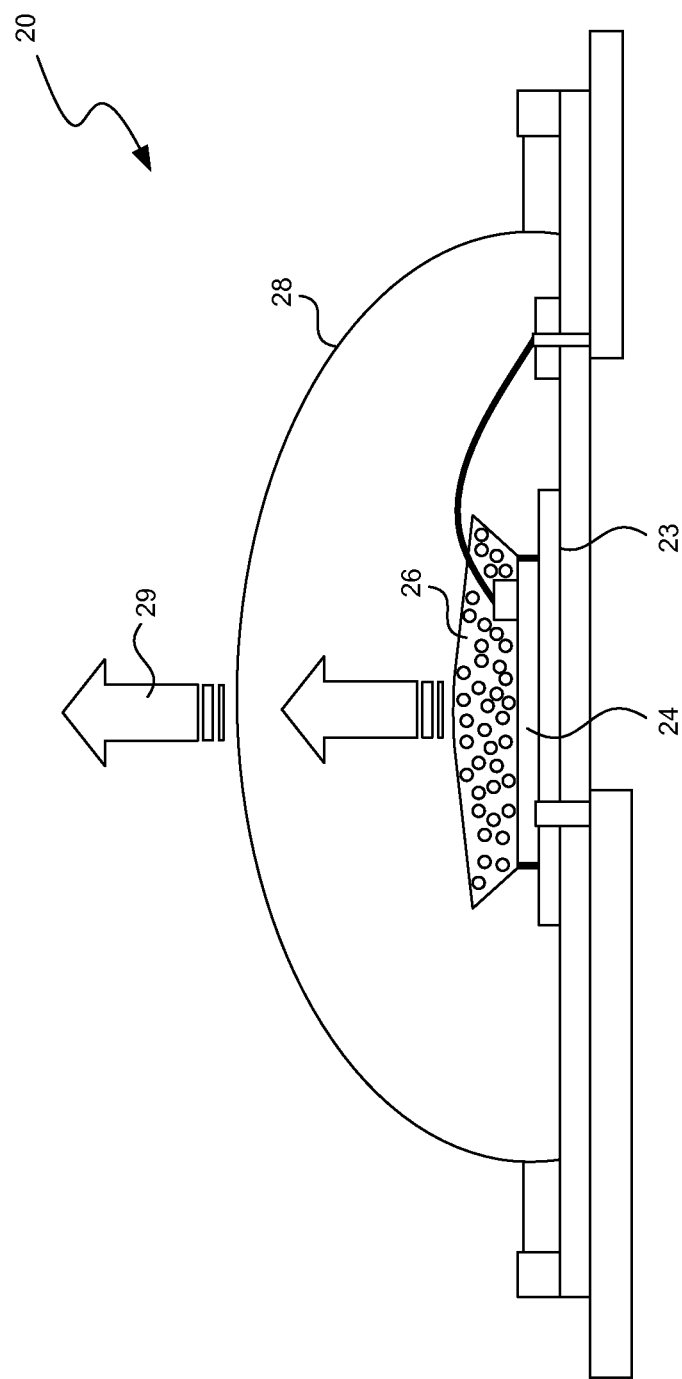
FIG. 2 is a partially schematic cross-sectional view of an SSL device in accordance with the prior art.
Figure 3:
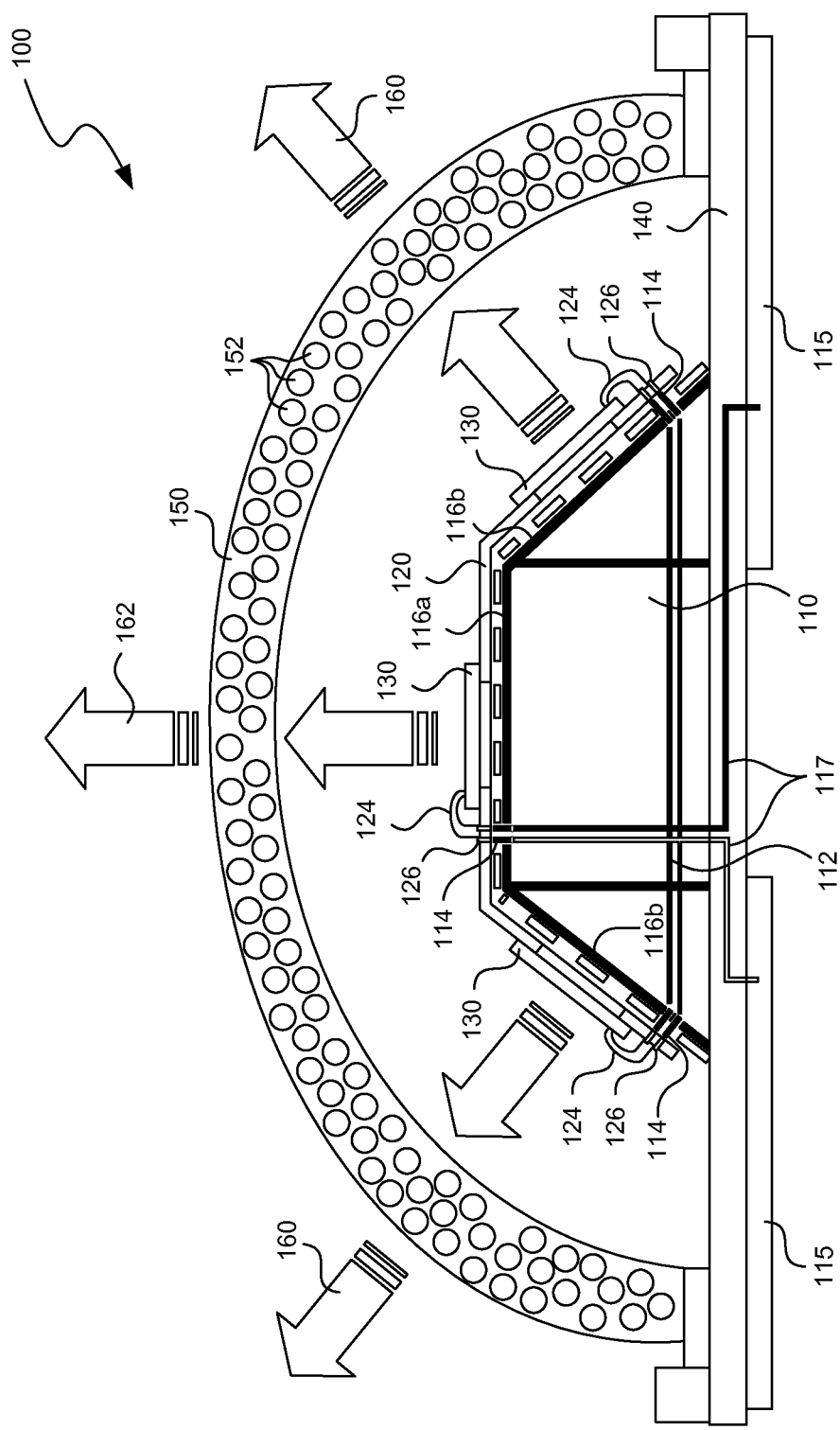
FIG. 3 is a partially schematic cross-sectional side view of an SSL device in accordance with several embodiments of the present technology.

FIG. 3 illustrates an SSL device 100 according to embodiments of the present technology. In several embodiments, the SSL device 100 includes a pillar 110, a flexible interface member 120 contacting the pillar 110 and a plurality of solid state emitters (SSEs) 130 mounted to various regions of the interface member 120 such that the SSEs 130 are angled away from one another in a divergent arrangement. The device 100 can also include a support 140 having electrical contacts 115 and a lens 150 constructed over the SSEs 130. The pillar 110 can be made of copper (Cu) or aluminum (Al) or another suitable material that conducts heat and/or electricity to and from the SSEs 130. The SSEs 130 can be connected in parallel or in series. In some embodiments, the pillar 110 is absent and the interface member is sufficiently rigid to maintain shape without the pillar 110 under the interface member 120. In these embodiments, the interface member 120 can include necessary electrical contacts. The pillar 110 can also be made from a dielectric or a combination of materials, including alloys of various metals. The pillar 110 can include pins 114 protruding from the pillar 110 and integrated wiring 112 connecting the pins 114 to the contacts 115 of the support 140. In embodiments in which the pillar 110 has conductive portions, the pins 114 can be electrically isolated from the pillar 110 and from any other electrically conductive portion that could contact the pins 114 and short an electrical connection. The support 140 can also include wiring 117 to convey electrical signals between the SSEs 130 and the contacts 115. In embodiments in which the pillar 110 is made of a conductive material, the pillar 110 itself can serve as the electrical path to the SSEs 130. The pillar 110 is shown with five sides or facets 116, including a central facet 116a and four outer facets 116b (two shown in cross-section, one extending behind the cross-section, and one extending in front of the cross-section). In other configurations, the pillar 110 can include more or fewer facets 116, which can be at different angles and orientations.

The flexible interface member 120 can be conductive, non-conductive or semi-conductive. For example, the flexible interface member 120 can be a flex-circuit having a flexible dielectric substrate and conductive traces. For example, the interface member 120 can be a sheet having conductive portions and non-conductive portions that is initially formed as a flat substrate. The SSEs 130 can be mounted to the interface member 120 using conventional mounting techniques while the interface member 120 is flat. For example, wirebonds 124 can be formed between the SSEs 130 and the interface member 120 before bending or otherwise deforming the interface member 120 to conform to the pillar 110. Other processes can be performed while the interface member 120 is flat. The flexible interface member 120 can also include apertures or vias 126 that are shaped and positioned to correspond to the pins 114 on the pillar 110. In embodiments in which the vias 126 include apertures, the vias 126 can have an electrically conductive material in the via 126 and extending onto a surface of the interface member 120 and connected to the wirebonds 124. The apertures of the vias 126 can be configured to mate with the pins 114 to electrically connect the SSEs 130 to the pins 114. The pins 114 and the interface member 120 can be electrically isolated from other components to provide an electrical path from the SSEs 130 through the pins 114 without shorting through a nearby conductor. In other embodiments, the vias 126 comprise through-connects such as conductive plugs wirebonded to the SSEs 140 on a first side of the interface member 120, and exposed to a second side of the interface member 120 that contacts the pins 114 but does not include an aperture. In this embodiment, the pins 114 can be shorter such that the interface member 120 lies flat upon the pillar 110 with the vias 126 contacting the pins 114.

In several embodiments, an advantage of the sloped facets 116 of the pillar 110 and the orientation of the SSEs 130 is that the light is distributed more evenly in outward directions 160 as well as in a central direction 162. The outward directions 160 can be angled relative to the central direction 162 by any suitable angle. Another advantage of the present disclosure is that with more light passing through the peripheral regions of the converter material 152, the converter material 152 is less susceptible to fatigue or burn-out that can occur with conventional designs in which the converter material 152 directly above the SSE 130 receives the most intense light. The overall light output from the SSL device 100 may be more similar to that of an incandescent light bulb. For certain applications, such as lamps and other lights, people are accustomed to this type of light rather than the more focused, directional light emitted by conventional SSL devices. The present disclosure achieves these lighting qualities using SSEs which can be more efficient than conventional incandescent bulbs.

In some embodiments, the lens 150 can be used to disperse the light from the SSEs 130. However, the sloped configuration of the SSEs 130 can distribute the light from the SSEs 130 sufficiently that the lens 150 is not needed and can therefore be omitted. An advantage of the device 100 without the lens 150 is that heat from the SSEs 130 can more easily be removed from the SSEs 130 with an active or passive air flow because the lens 150 tends to thermally insulate the SSEs 130. In these embodiments, the converter material 152 can be placed in phosphor wells directly over individual SSEs 130, or can be placed in another portion of the optical path of the SSEs 130. In some embodiments, the SSEs 130 can be cooled by ambient air.

FIGS. 4A-7 illustrate the interface member 120 and processes of assembling SSL devices according to several embodiments of the present technology. FIG. 4A shows a top view of a flexible interface member 120 having five sections 180 including a central section 180a and four outer sections 180b. In some embodiments, more or fewer sections 180 are included. In some embodiments, each section 180 can contain a first bonding pad 182a and a second bonding pad 182b on a first side of the interface member 120. The first bonding pad 182a and the second bonding pad 182b can be connected to vias 126 in the sections 180. In some embodiments, the first bonding pad 182a can be a front side bonding pad that is connected to an SSE through a wirebond to a front side of an SSE, and the second bonding pad 182b can be a backside bonding pad having an electrically conductive line 185 on the interface member 120 electrically connected to a contact on the backside of an SSE. The interface member 120 can also include integrated wiring (not shown) formed inside the interface member 120 and connected to the bondpads 182a, 182b. Each section 180 can also include a heat sink 184 that contacts an SSE and conducts heat from the SSE. In some embodiments, the heat sink 184 can also be electrically conductive and can be used as the second electrical contact to the SSE instead of the second bonding pad 182b and conductive line 185. FIG. 4B is a cross-sectional view along a section 180 across a line labeled "4B" in FIG. 4A. In several embodiments, the heat sink 184 extends through the interface member 120 at a central portion of the section 180. The vias 126 are also shown extending through the interface member 120 with bonding pads 182a connected to the vias 126.

Referring back to FIG. 4A, the interface member 120 can also have preferential folding features 186 to easily shape the interface member 120 to conform to the pillar 110. For example, the folding features 186 can include a perforation, a slit, a groove, a score line, or other suitable structure that causes the interface member 120 to preferentially fold along the folding feature 186. In some embodiments, the folding feature 186 between sections 180 can be a perforation, or other thinning or removal of material between the sections 180. In other embodiments, the interface member 120 is made of a flexible material throughout the interface member 120 which can then be bent into shape over the pillar 110 without a folding feature 186. The interface member 120 can have varying numbers of sections 180, and the sections 180 can have different characteristics. For example, some of the sections 180 can include more than one pair of bondpads 182a, 182b, some sections 180 can be larger or smaller than other sections 180, and some sections can carry more than one SSE or no SSE at all. In some embodiments the central section 180a can be triangular, square, pentagonal, or hexagonal or other geometries or shapes such that the interface member 120 has three, four, five, six or more outer sections 180b, respectively, extending from the central section 180a. In yet other embodiments, the sections 180 can form shapes without a single, central section 180a.

Figures 5A, 5B:
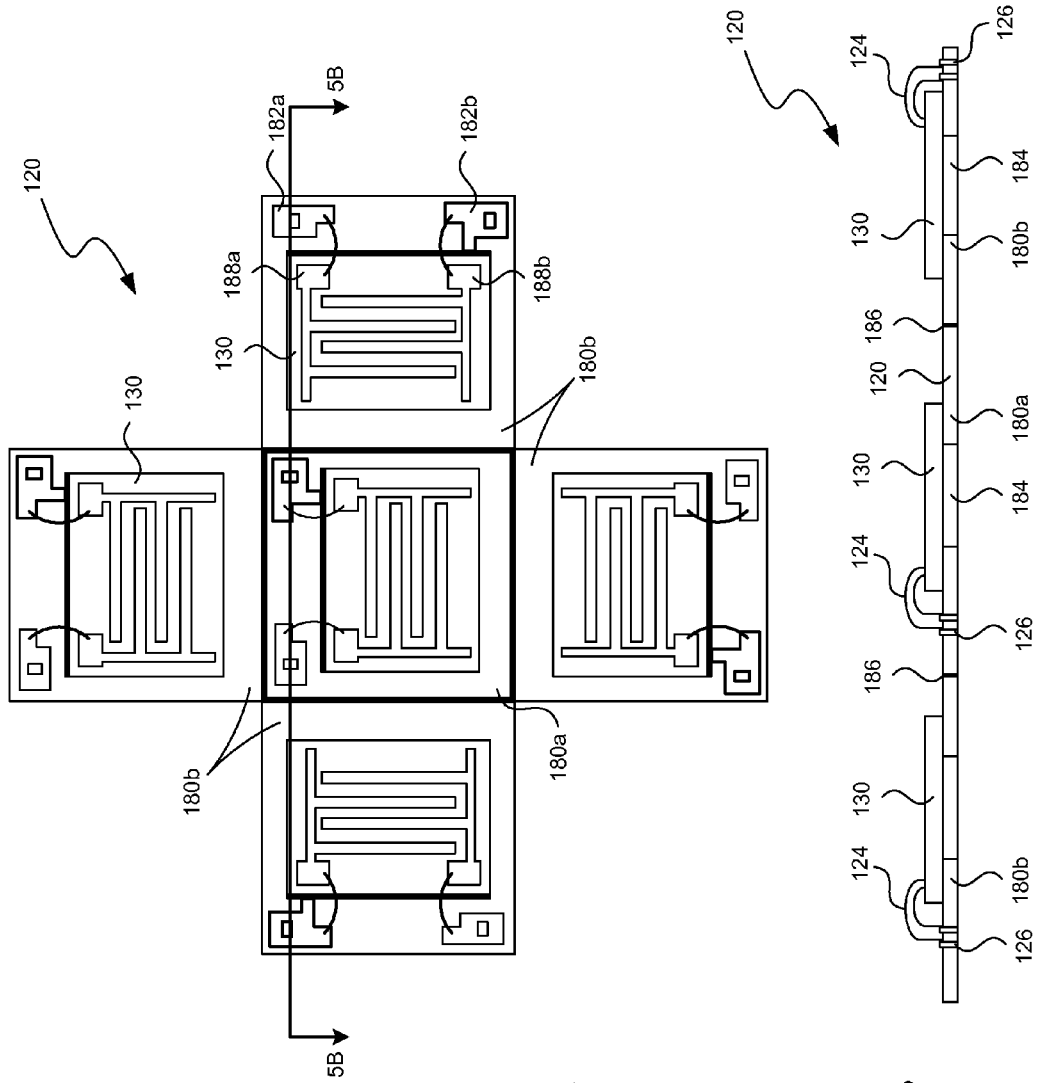
FIG. 5A is a partially schematic top view of an interface member for use with an SSL device in accordance with several embodiments of the present technology.
FIG. 5B is a partially schematic cross-sectional view of the interface member of FIG. 5A in accordance with several embodiments of the present technology.

FIGS. 5A and 5B illustrate another embodiment of the interface member 120. In FIG. 5A, the first bonding pads 182a and the second bonding pads 182b are wirebonded to the SSE 130 at a first contact 188a and a second contact 188b, respectively. FIG. 5B is a cross-sectional view through three sections 180 of the interface member 120 shown in FIG. 5A. As stated above, the SSEs 130 can be mounted and/or wirebonded to the interface member 120 while the interface member 120 is generally flat using conventional mounting and/or wirebonding techniques. Other processes that are conventionally performed on flat substrates can also be performed while the interface member 120 is flat, such as forming the heat sink 184, singulating the interface member 120, etc.

Figure 6:
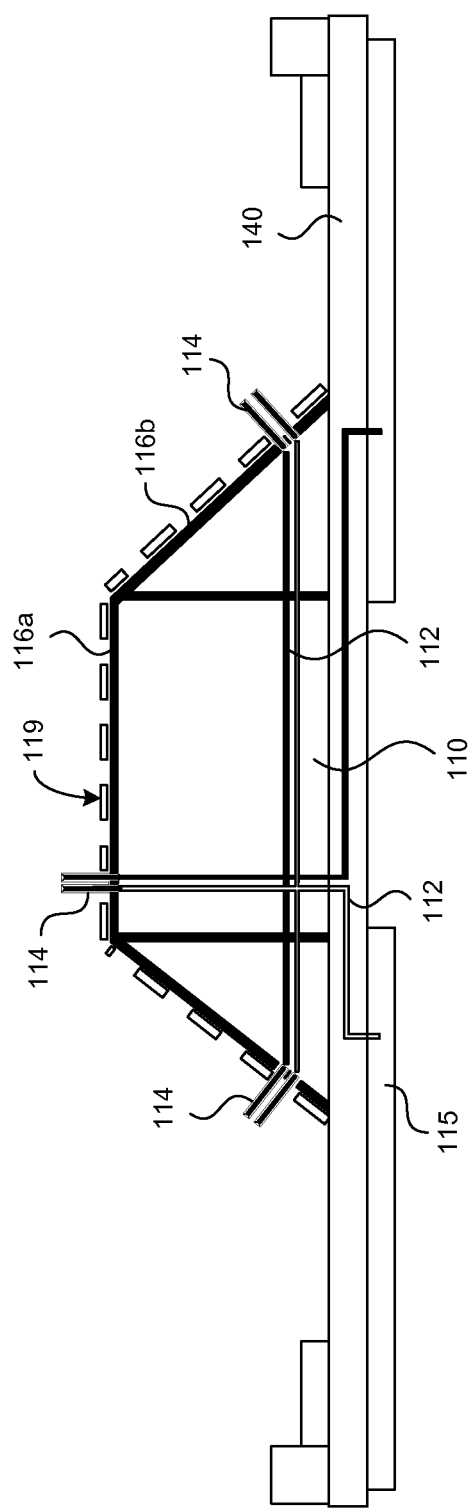
FIG. 6 is a partially schematic cross-sectional side view of a pillar and support for an SSL device in accordance with embodiments of the present technology.

FIG. 6 illustrates the pillar 110 and support 140 before mounting the interface member 120 to the pillar 110 according to several embodiments of the present technology. At this stage of the manufacturing process, the pillar 110 can be prepared with an adhesive 119 on facets 116 of the pillar 110. The adhesive 119 can be a tape, glue, thermal paste, a conductive adhesive, a conductive paste, or other adhesive and/or thermally conductive component. The pins 114 can be prepared to contact the interface member 120 and engage the vias 126 of the interface member 120. The pins 114 can be long enough to protrude through apertures in the vias 126. Alternately, when the vias 126 are solid electrically conductive material, the pins 114 can be relative short and positioned to contact the vias 126 with the interface member 120 lying flat upon the pillar 110. Integral wiring 112 can be formed within the pillar 110 and contacting the pins 114 to form an electrical path from the SSEs 130 to contacts 115 in the support 140. In other embodiments, the pillar 110 can be made of a conductive material and can conduct electricity and heat from the SSEs 140, in which case integral wiring 112 is unnecessary.

FIGS. 7A and 7B illustrate another embodiment according to the present disclosure in which a plurality of SSL devices 100 are arranged in an array 200 upon a support 140. FIG. 7B is a cross-sectional view of the array 200 along line 7B shown in FIG. 7A. The SSL devices 100 can be similar to the SSL devices 100 discussed above. The array 200 includes several three-section SSL devices 100 arranged in a row to produce dispersed light similar to an elongated fluorescent light. Other SSL device configurations, and other array patterns, are possible. For example, the cross-shaped SSL devices 100 shown above can be used in the array 200 in a suitable pattern such as rows and columns. The light distribution from the array 200 can have a similarly dispersed characteristic as the individual SSL devices 100 discussed above.

Figure 8B:
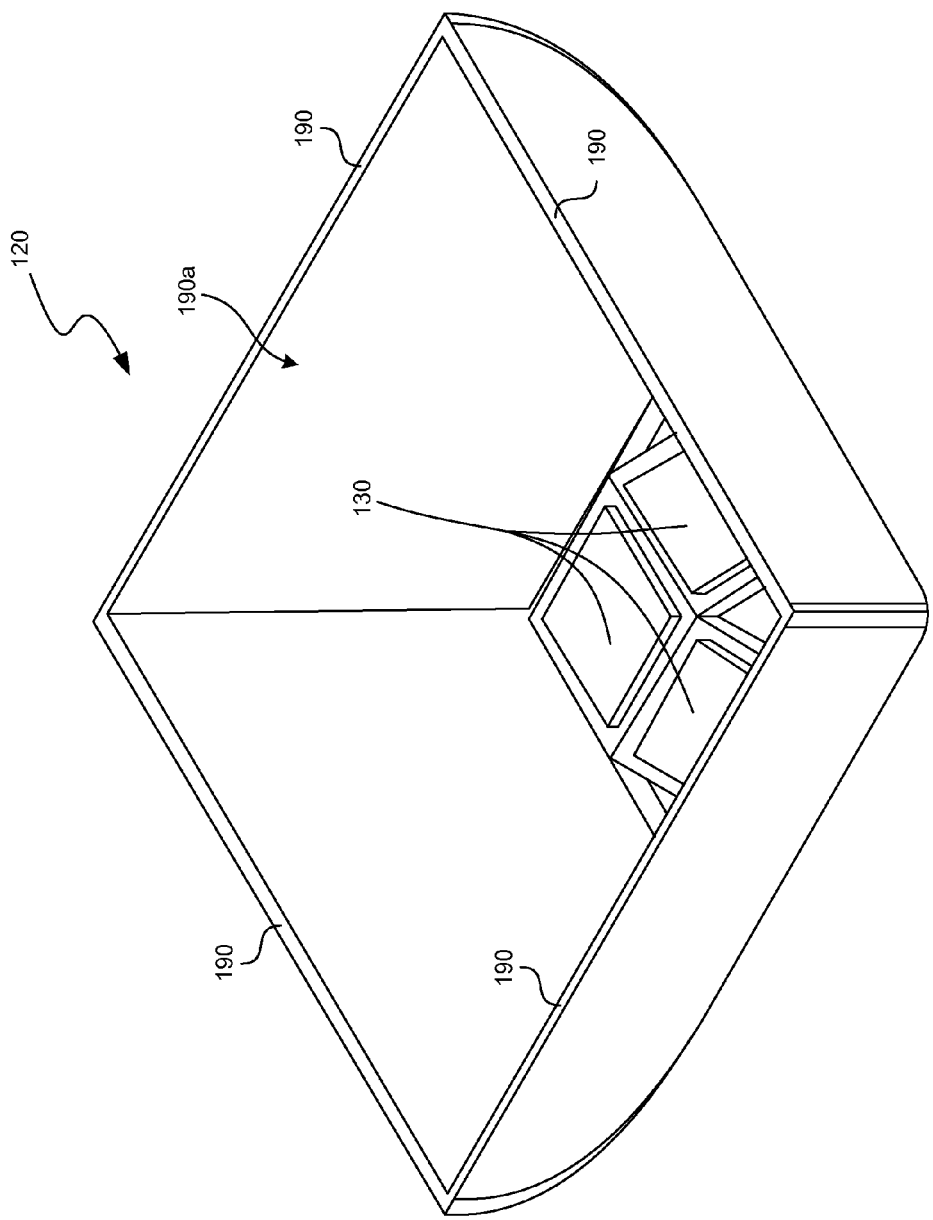
FIG. 8B is a partially schematic isometric view of the interface member and extensions of FIG. 8A formed into a reflective cup for use with an SSL device in accordance with embodiments of the present technology.
Figure 8C:
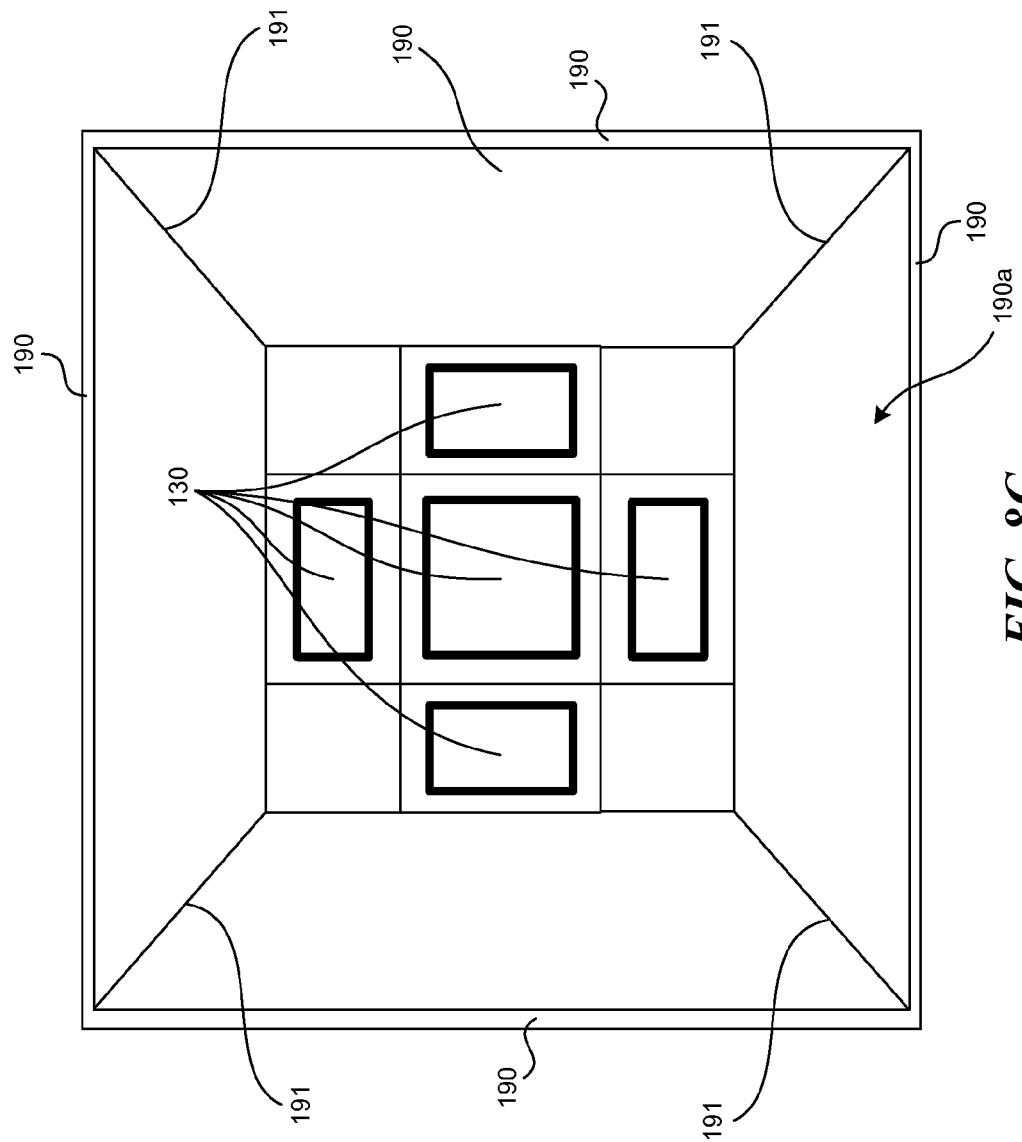
FIG. 8C is a partially schematic top view of the interface member and extensions of FIGS. 8A and 8B formed into a reflective cup for use in an SSL device in accordance with embodiments of the present technology.

FIGS. 8A-8C illustrate an interface member 120 in accordance with still other embodiments of the present technology. The interface member 120 can include several sections 180, including a central section 180a and outer sections 180b. The sections 180 can each carry one or more SSEs 130 mounted and/or wirebonded to the sections 180 as discussed above.

The interface member 120 can also include reflective extensions 190 extending from the outer sections 180b. The extensions 190 can be made of a reflective material, or they can be coated with a reflective material. The reflective surface of the extensions 190 can be designed according to a desired application of the interface member 120. The extensions 190 can also be coated with a converter material to further alter the wavelength of light reflected from the extensions 190. In some embodiments, the reflective surface of the extensions 190 includes a diffuser, such as a multi-faced crystal type surface, that can change qualities of the output light, such the temperature of the light. FIG. 8A shows an embodiment in which the extensions 190 are formed integrally with outer sections 180b when the interface member 120 is flat. The SSEs 130 can be mounted to the sections 180 while the interface member 120 is flat as described above. FIG. 8B is an isometric view of the interface member 120 at a later stage in which the extensions 190 are folded into a reflective cup 190a surrounding the SSEs 130. The extensions 190 can reflect light from the SSEs 130 in a directed or diffuse manner. The contour of the sides of the reflective cup 190a can be flat, convex, concave, or parabolic. Each shape reflects light in a different way. For example, parabolic and concave shapes tend to focus the light toward a point, but a convex contour will diffuse light from the SSEs 130 in a more distributed manner.

FIG. 8C shows a top view of the interface member 120 with the extensions 190 formed into the reflective cup 190a. The edges 191 of the extensions 190 can be formed to abut neighboring extensions 190 when formed into the reflective cup 190a. As discussed above, the interface member 120 can be pressed against a pillar 110 to shape the flat interface member 120 into the divergent arrangement shown in FIG. 3A and elsewhere herein. In several embodiments, the extensions 190 can be shaped using a similar technique. For example, a die or press (not shown) can press the interface member 120 against the pillar 110 and press the extensions 190 against an opposing surface (not shown) to form the reflective cup 190a. In some embodiments, a single process, using a single die, can be used to form the sections 180 and the extensions 190 into their proper, three-dimensional shape.

In each of the foregoing embodiments, the lens 150 (FIG. 3) can be optional and formed of injection molded silicone or other suitable material. The lens 150 can also include a converter material 152 such as phosphor. The lens 150 can simply transmit the light from the SSEs 130 and converter material 152 or it can further focus or otherwise alter characteristics of the light.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. For example, the pillar and substrate can be made of different materials than those explicitly listed herein as understood by a person or ordinary skill in the art. While sections of the substrate have been described herein as being "outer" relative to other sections, these sections may or may not be "outermost" depending on different applications. Further, while advantages (e.g., angular light distribution advantages) associated with certain embodiments of the disclosure may have been described in the context of those embodiments, other embodiments may also exhibit such advantages, and not all embodiments need necessarily exhibit such advantages to fall within the scope of the disclosure. Accordingly, the present disclosure and associated technology can encompass other embodiments not expressly shown or described herein.

We claim:

1. A method, comprising:
    attaching a plurality of solid state emitters (SSEs) to a first side of a flexible interface member while the interface member is at least generally planar;
    connecting electrical leads of the SSEs to contacts on the interface member while the interface member is at least generally planar;
    contacting a second side of the flexible interface member to a pillar, the pillar having a first facet oriented in a first direction and at least a second facet sloping at an acute angle relative to the first facet and oriented in a second direction;
    mounting the flexible interface member to the pillar with a first section of the flexible interface member contacting the first facet and a second section of the flexible interface member contacting the second facet of the pillar such that at least one of the SSEs emits light generally in the first direction and another one of the SSEs emits light generally in the second direction; and
    electrically connecting the SSEs to the pillar through the contacts.

2. The method of claim 1, further comprising aligning the bondpads with pins extending from the pillar protruding through vias in the bondpads.

3. The method of claim 1 wherein mounting the flexible interface member against the pillar comprises bending the flexible interface member at preferential fold lines.

4. The method of claim 1 wherein attaching the plurality of SSEs comprises mounting the SSEs to the interface member using techniques for planar die mounting while the interface member is flat.

5. The method of claim 1 wherein mounting the flexible interface member against the pillar comprises contacting the first side of the interface member with a press and applying a force against the interface member against the pillar.

6. The method of claim 1, further comprising disposing at least one of a thermal paste, a conductive adhesive, or a conductive paste upon the pillar between the pillar and the interface member.

7. The method of claim 1 wherein mounting the interface member comprises bending the interface member along a line between the first and second sections, pressing the first section against the first facet, and pressing the second section against the second facet.

8. The method of claim 1 wherein bending the interface member comprises folding the second section relative to the first section along a preferential folding feature between the first and second sections.

9. The method of claim 8 wherein the preferential folding feature comprises a perforation, slit, groove or score line.

10. The method of claim 1 wherein the contacts comprise first and second bondpads, and connecting the electrical leads of the SSEs comprises forming first and second wirebonds coupled to the first and second bondpads, respectively, before mounting the interface member to the pillar.

11. The method of claim 1 wherein the contacts comprise a bondpad and a heat sink, and connecting the electrical leads of the SSEs comprises forming a wirebond from one SSE lead to the bondpad and surface mounting another SSE lead to the heat sink.

12. A method of assembling a solid state lighting device, comprising:
    forming a pillar having a plurality of facets facing in different directions and a plurality of electrical contacts on the pillar, wherein the plurality of facets include a first facet oriented in a first direction and at least a second facet sloping at an acute angle relative to the first facet and oriented in a second direction;
    pressing an interface member having a plurality of sections against the pillar such that the interface member bends between sections and individual sections contact a corresponding facet of the pillar, the interface member having conductive traces on a first side and through-connects exposed on a first side and a second side of the interface member, wherein the interface member carries a plurality of solid state emitters (SSEs) connected to the conductive traces such that at least one SSE is at each section of the interface member and such that at least one of the SSEs emits light generally in the first direction and another one of the SSEs emits light generally in the second direction; and
    electrically connecting the SSEs to the pillar.

13. The method of claim 12 wherein the pillar includes conductive pins extending from the facets, the pins being positioned on the facets to correspond positionally with the through-connects.

14. The method of claim 13 wherein the through-connects comprise a conductive plug in the interface member, and wherein electrically connecting the SSEs to the pillar comprises aligning the conductive plug with the pins.

15. The method of claim 13 wherein the through-connects comprise apertures with a conductive surface in the apertures, and wherein electrically connecting the SSEs to the pillar comprises aligning the pins in corresponding openings.

16. The method of claim 12, further comprising forming a reflective cup from a plurality of reflective extensions of the interface member.

17. The method of claim 16 wherein the reflective cup includes sidewalls having a contour, and wherein the contour comprises at least one of a flat shape, a convex shape, a concave shape, or a parabolic shape.

* * * * *